US012765229B2

(12) United States Patent
Park et al.

(10) Patent No.: US 12,765,229 B2
(45) Date of Patent: Oct. 13, 2026

(54) DISPLAY DEVICE AND METHOD FOR MANUFACTURING THE SAME

(71) Applicant: Samsung Display Co., LTD., Yongin-si (KR)

(72) Inventors: Byung-Kyu Park, Yongin-si (KR); Jongoh Kim, Yongin-si (KR); Gyumin Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 655 days.

(21) Appl. No.: 18/137,596

(22) Filed: Apr. 21, 2023

(65) Prior Publication Data

US 2024/0057450 A1 Feb. 15, 2024

(30) Foreign Application Priority Data

Aug. 9, 2022 (KR) ........................ 10-2022-0099140

(51) Int. Cl.

| | |
|---|---|
| ***H10K 59/80*** | (2023.01) |
| ***H10K 59/38*** | (2023.01) |
| ***H10K 71/13*** | (2023.01) |

(52) U.S. Cl.

CPC ........... *H10K 59/873* (2023.02); *H10K 59/38* (2023.02); *H10K 71/135* (2023.02)

(58) Field of Classification Search

CPC ..... H10K 59/873; H10K 71/135; H10K 59/38

USPC .......................................................... 313/498

See application file for complete search history.

(56) References Cited

U.S. PATENT DOCUMENTS

| | | | | |
|---|---|---|---|---|
| 2014/0264300 A1* | 9/2014 | Kamiya | H10K 50/16 257/40 |
| 2019/0346719 A1* | 11/2019 | Li | G02F 1/13471 |
| 2019/0372052 A1* | 12/2019 | Kishimoto | H10K 59/122 |
| 2020/0211451 A1* | 7/2020 | Akimoto | G09G 3/32 |
| 2021/0408476 A1 | 12/2021 | Choi et al. | |

(Continued)

FOREIGN PATENT DOCUMENTS

| | | |
|---|---|---|
| CN | 113611809 A | 11/2021 |
| KR | 20140113541 A | 9/2014 |
| KR | 101513869 B1 | 4/2015 |

(Continued)

OTHER PUBLICATIONS

K-PION Patent Search (Year: 2023).*

(Continued)

*Primary Examiner* — James R Greece
*Assistant Examiner* — Hana S Featherly
(74) *Attorney, Agent, or Firm* — CANTOR COLBURN LLP

(57) ABSTRACT

A display device includes: a plurality of light emitting elements; an encapsulation layer disposed on the light emitting elements to cover the light emitting elements; a foreign substance disposed on at least one of the light emitting elements, where the foreign substance is disposed through at least a portion of the encapsulation layer and a protruding part is defined by a portion protruding from a top flat surface of the encapsulation layer by the foreign substance; a reinforcing filling layer disposed on the encapsulation layer to cover the protruding part; a filling layer disposed on the encapsulation layer and the reinforcing filling layer; and a color conversion layer disposed on the filling layer.

10 Claims, 15 Drawing Sheets

(56) References Cited

U.S. PATENT DOCUMENTS

2022/0393135 A1* 12/2022 Choi ...................... H10K 59/13

FOREIGN PATENT DOCUMENTS

KR 20190014962 * 2/2019
KR 20220000388 A 1/2022

OTHER PUBLICATIONS

English translation of KR 10-2019-0014962 A (Year: 2019).*
Office Action dated Jan. 18, 2026 for Korean Patent Application No. 10-2022-0099140, 11 pages.

* cited by examiner

DISPLAY DEVICE AND METHOD FOR MANUFACTURING THE SAME

This application claims priority to Korean Patent Application No. 10-2022-0099140, filed on Aug. 9, 2022, and all the benefits accruing therefrom under 35 U.S.C. § 119, the content of which in its entirety is herein incorporated by reference.

BACKGROUND

1. Field

Embodiments of the disclosure relate to an organic light emitting display device and a method for manufacturing the organic light emitting display device.

2. Description of the Related Art

An organic light emitting display device refers to a device configured to display an image by combining lights emitted from organic light emitting materials. The organic light emitting display device may include a light emitting element substrate including an organic light emitting material, and a color conversion substrate including a color conversion layer configured to convert a wavelength of a light emitted from the organic light emitting material to emit lights having predetermined colors.

SUMMARY

A process of manufacturing the organic light emitting display device may include a process of bonding the color conversion substrate to the light emitting element substrate. In such a process, when a foreign substance is present in an encapsulation layer covering the organic light emitting material of the light emitting element substrate, cracks may be generated in the encapsulation layer, such that the organic light emitting material may be damaged.

Embodiments of the disclosure provide a display device with improved display quality.

Embodiments of the disclosure provide a method for manufacturing the display device.

According to embodiments, a display device includes: a plurality of light emitting elements; an encapsulation layer disposed on the light emitting elements to cover the light emitting elements; a foreign substance disposed on at least one of the light emitting elements, wherein the foreign substance is disposed through at least a portion of the encapsulation layer, a protruding part of the encapsulation layer is defined by a portion protruding from a top flat surface of the encapsulation layer by the foreign substance; a reinforcing filling layer disposed on the encapsulation layer to cover the protruding part of the encapsulation layer; a filling layer disposed on the encapsulation layer and the reinforcing filling layer; and a color conversion layer disposed on the filling layer.

According to an embodiment, the encapsulation layer may include: a first encapsulation layer disposed on the light emitting elements, and including an inorganic insulating material; a second encapsulation layer disposed on the first encapsulation layer, and including an organic insulating material; and a third encapsulation layer disposed on the second encapsulation layer, and including an inorganic insulating material.

According to an embodiment, the foreign substance may be disposed through at least a portion of the second encapsulation layer.

According to an embodiment, the filling layer may be in direct contact with the reinforcing filling layer and spaced apart from the encapsulation layer.

According to an embodiment, the filling layer may include a same material as a material included in the reinforcing filling layer.

According to an embodiment, the protruding part may include at least one selected from a portion of the foreign substance protruding from the top flat surface of the encapsulation layer and a portion of the encapsulation layer in which a profile of a top surface of the encapsulation layer covering the foreign substance protrudes in a thickness direction of the encapsulation layer.

According to an embodiment, the reinforcing filling layer may cover the portion of the foreign substance protruding from the top flat surface of the encapsulation layer.

According to an embodiment, the display device may further include a protective layer disposed between the filling layer and the color conversion layer.

According to an embodiment, the color conversion layer may include at least one selected from a color conversion particle and a scattering particle.

According to an embodiment, a value obtained by dividing a luminance of a light in an overlapping region by an area of the overlapping region when viewed in a plan view may be about 95% or greater and about 105% or less of a value obtained by dividing a luminance of a light in a non-overlapping region by an area of the non-overlapping region when viewed in a plan view, where the overlapping region is defined as a region in which a light emitted from an overlapping-light emitting element overlapping the reinforcing filling layer when viewed in the plan view among the light emitting elements is visually recognized, and the non-overlapping region is defined as a region in which a light emitted from a non-overlapping-light emitting element not overlapping the reinforcing filling layer when viewed in the plan view among the light emitting elements is visually recognized.

According to embodiments, a method for manufacturing a display device includes: forming an encapsulation layer to cover a plurality of light emitting elements; detecting a position of a foreign substance disposed through at least a portion of the encapsulation layer to define a protruding part, which is a portion protruding from a top flat surface of the encapsulation layer by the foreign substance; forming a reinforcing filling layer on the encapsulation layer to cover the protruding part of the encapsulation layer; and bonding a color conversion substrate, which includes a filling layer and a color conversion layer disposed on the filling layer, onto the reinforcing filling layer.

According to an embodiment, the forming of the encapsulation layer may include: forming a first encapsulation layer including an inorganic insulating material on the light emitting elements; forming a second encapsulation layer including an organic insulating material on the first inorganic encapsulation layer; and forming a third encapsulation layer including an inorganic insulating material on the second encapsulation layer.

According to an embodiment, the detecting the position of the foreign substance may include: detecting a first position of a first foreign substance after the forming the first encapsulation layer; detecting a second position of a second foreign substance after the forming the second encapsulation layer; and detecting a third position of a third foreign substance after the forming the third encapsulation layer.

According to an embodiment, the detecting the position of the foreign substance may further include: inspecting a profile of a top surface of the encapsulation layer at the first position, the second position, and the third position; and obtaining position information of the protruding part based on the profile of the top surface of the encapsulation layer.

According to an embodiment, the forming of the reinforcing filling layer may include forming the reinforcing filling layer on the protruding part based on the position information of the protruding part.

According to an embodiment, the reinforcing filling layer may include a same material as a material included in the filling layer.

According to an embodiment, the method for manufacturing the display device may further include: measuring a first value obtained by dividing a luminance of a light in an overlapping region by an area of the overlapping region when viewed in a plan view, where the overlapping region is defined as a region in which a light emitted from an overlapping-light emitting element overlapping the reinforcing filling layer when viewed in the plan view among the light emitting elements is visually recognized; measuring a second value obtained by dividing a luminance of a light in a non-overlapping region by an area of the non-overlapping region when viewed in a plan view, where a non-overlapping region is defined as a region in which a light emitted from a non-overlapping-light emitting element not overlapping the reinforcing filling layer when viewed in the plan view among the light emitting elements is visually recognized; and compensating a luminance of the light emitted from the overlapping-light emitting element in a way such that the first value is about 95% or greater and about 105% or less of the second value.

According to an embodiment, the compensating for of the luminance of the light emitted from the overlapping-light emitting element may include: obtaining a proportion occupied by an area of the reinforcing filling layer overlapping the overlapping-light emitting element when viewed in the plan view in the area of the overlapping region when viewed in the plan view; and increasing the luminance of the light emitted from the overlapping-light emitting element based on the proportion.

According to an embodiment, the filling layer may be in direct contact with the reinforcing filling layer and spaced apart from the encapsulation layer.

According to an embodiment, the reinforcing filling layer may be formed by an inkjet scheme.

According to embodiments, the display device may include: a plurality of light emitting elements; an encapsulation layer disposed on the light emitting elements to cover the light emitting elements; a foreign substance disposed on at least one of the light emitting elements, where the foreign substance is disposed through at least a portion of the encapsulation layer such that a protruding part is defined by a portion protruding from a top flat surface of the encapsulation layer by the foreign substance; a reinforcing filling layer covering the protruding part of the encapsulation layer; a filling layer disposed on the encapsulation layer and the reinforcing filling layer; and a color conversion layer disposed on the filling layer. Accordingly, the reinforcing filling layer may effectively prevent cracks from being generated in the encapsulation layer by the foreign substance.

According to embodiments, the method for manufacturing a display device may include: forming an encapsulation layer to cover a plurality of light emitting elements; detecting a position of a foreign substance disposed through at least a portion of the encapsulation layer to define a protruding part which is a portion protruding from a top flat surface of the encapsulation layer by the foreign substance; forming a reinforcing filling layer on the encapsulation layer to cover the protruding part; and bonding a color conversion substrate, which includes a filling layer and a color conversion layer disposed on the filling layer, onto the reinforcing filling layer. Accordingly, cracks may be effectively from being generated in the encapsulation layer by the foreign substance in a process of manufacturing the display device.

However, effects of the disclosure are not limited to the above-described effects, and may be variously expanded without departing from the idea and scope of the disclosure.

DETAILED DESCRIPTION

Figure 1:
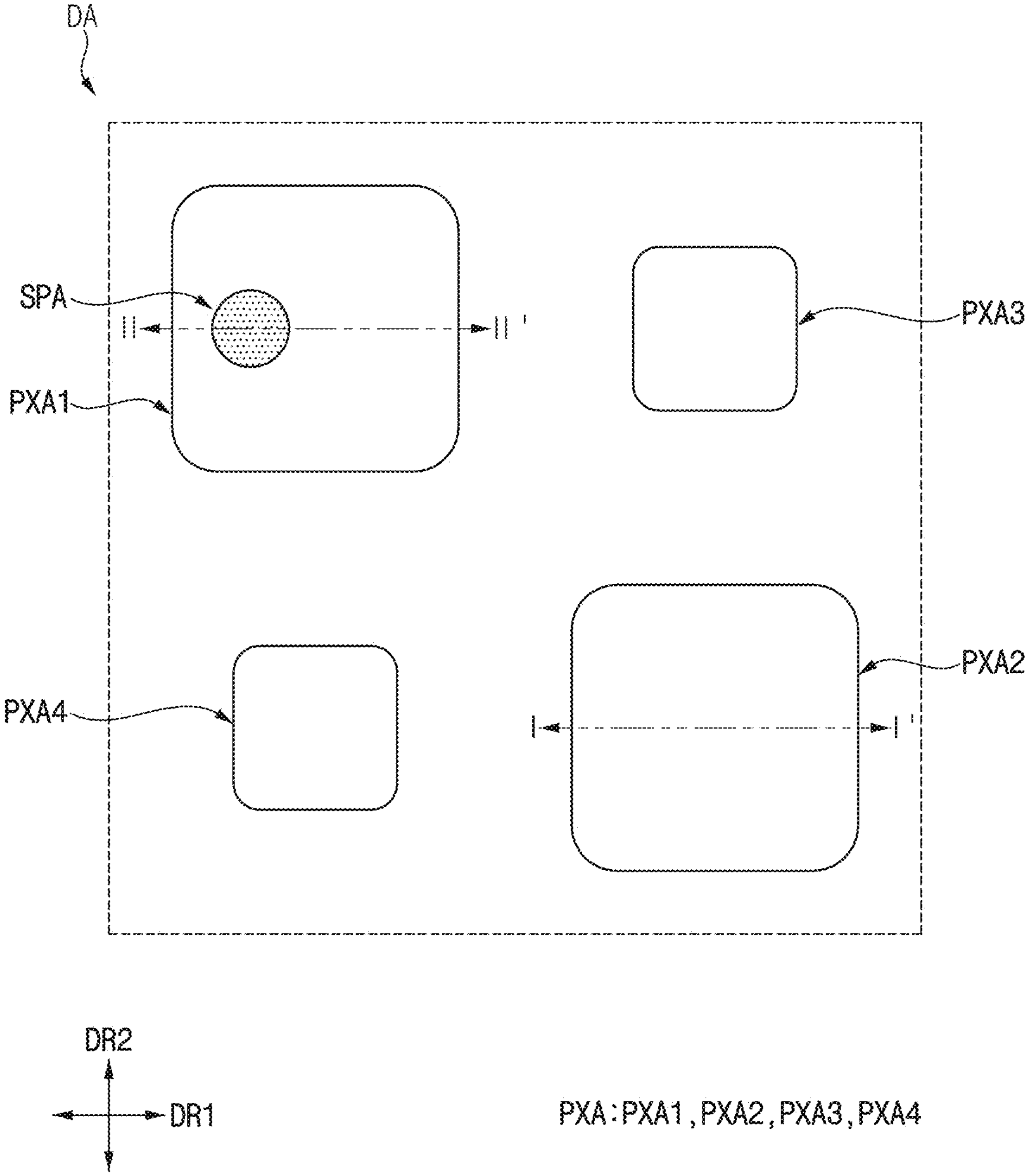
FIG. 1 is a plan view showing a display region of a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a display device and a method for manufacturing a display device according to embodiments of the disclosure will be described in detail with reference to the accompanying drawings. The same or similar reference numerals will be used for the same elements in the accompanying drawings.

FIG. 1 is a plan view showing a display region of a display device according to an embodiment of the disclosure.

Referring to FIG. 1, according to an embodiment of the disclosure, a display device may include a display region DA. In FIG. 1, only a portion of the display region DA has been shown for convenience of illustration and description.

The display region DA may include a pixel region PXA. The pixel region PXA may be defined as a region from which a light is substantially emitted in the display region DA. In an embodiment, for example, the pixel region PXA may be defined as a region in which a light is substantially emitted from a light emitting material (EL2 of FIG. 2 and EL1 of FIG. 3) that will be described below.

The pixel region PXA may include a plurality of sub-pixel regions. In an embodiment, for example, as shown in FIG. 1, the pixel region PXA may include a first sub-pixel region PXA1, a second sub-pixel region PXA2, a third sub-pixel region PXA3, and a fourth sub-pixel region PXA4.

A light emitted from the first sub-pixel region PXA1 may be visually recognized as a blue light by a user of the display device. An area of the first sub-pixel region PXA1 may be larger than an area of each of the second to fourth sub-pixel regions PXA2, PXA3, and PXA4 when viewed in a plan view.

The second sub-pixel region PXA2 may be spaced apart from the first sub-pixel region PXA1 in a first direction DR1 and a second direction DR2 intersecting the first direction DR1. A light emitted from the second sub-pixel region PXA2 may be visually recognized as a red light by the user of the display device. An area of the second sub-pixel region PXA2 may be larger than an area of each of the third and fourth sub-pixel regions PXA3 and PXA4 when viewed in a plan view.

The third sub-pixel region PXA3 may be spaced apart from the first sub-pixel region PXA1 in the first direction DR1, and the fourth sub-pixel region PXA4 may be spaced apart from the first sub-pixel region PXA1 in the second direction DR2. Each of a light emitted from the third sub-pixel region PXA3 and a light emitted from the fourth sub-pixel region PXA4 may be visually recognized as a green light by the user of the display device. An area of the third sub-pixel region PXA3 may be substantially equal to an area of the fourth sub-pixel region PXA4 when viewed in a plan view.

Since the above-described arrangements and areas of the sub-pixel regions included in the pixel region PXA when viewed in a plan view have been provided for illustrative purposes, the disclosure is not limited thereto. The sub-pixel regions included in the pixel region PXA may have various arrangements and areas when viewed in a plan view. In an alternative embodiment, for example, the sub-pixel regions may have various arrangements such as a stripe arrangement and a diamond arrangement when viewed in a plan view. In such an embodiment, the sub-pixel regions may have substantially the same area when viewed in a plan view, or may have mutually different areas when viewed in a plan view. Hereinafter, however, for convenience of description, the description will be given based on the first to fourth sub-pixel regions PXA1, PXA2, PXA3, and PXA4 shown in FIG. 1.

According to an embodiment, some sub-pixel regions among the sub-pixel regions may include a reinforcing region SPA. The reinforcing region SPA may be defined as a region in which a reinforcing filling layer FM_A is disposed or formed to prevent cracks from being generated in the encapsulation layer EN by a foreign substance IMP that will be described below. Hereinafter, for convenience of description, an embodiment in which the first sub-pixel region PXA1 includes the reinforcing region SPA will be described with reference to FIGS. 1 to 3.

Figure 2:
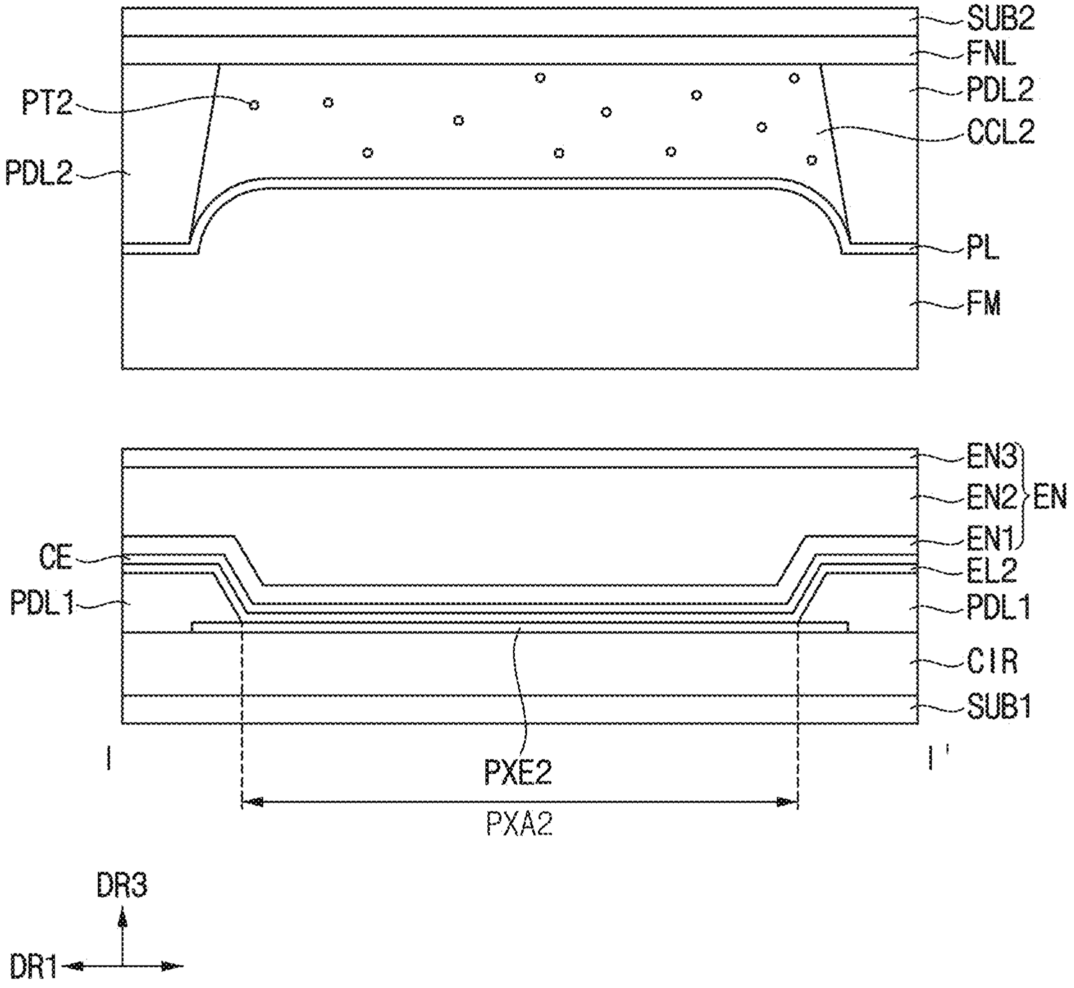
FIG. 2 is a cross-sectional view taken along line I-I' of FIG. 1.

FIG. 2 is a cross-sectional view taken along line I-I' of FIG. 1.

Referring to FIG. 2, according to an embodiment of the disclosure, the display device may include a first substrate SUB1, a circuit layer CIR, a second pixel electrode PXE2, a first partition wall (or pixel defining layer) PDL1, a second light emitting material EL2, a common electrode CE, an encapsulation layer EN, a filling layer FM, a protective layer PL, a second partition wall PDL2, a second color conversion material CCL2, a functional layer FNL, and a second substrate SUB2.

The first substrate SUB1 may include glass, plastic, or the like. According to an embodiment, the first substrate SUB1 may have a flexible property.

The circuit layer CIR may be disposed on the first substrate SUB1. The circuit layer CIR may include at least one insulating layer and at least one transistor. In an embodiment, for example, the circuit layer CIR may include a second driving transistor electrically connected to the second pixel electrode PXE2.

The second pixel electrode PXE2 may be disposed on the circuit layer CIR. The second pixel electrode PXE2 may include a conductive material. In an embodiment, for example, the second pixel electrode PXE2 may include silver, a silver-containing alloy, titanium, a titanium-containing alloy, molybdenum, a molybdenum-containing alloy, aluminum, an aluminum-containing alloy, aluminum nitride, tungsten, tungsten nitride, copper, indium-tin oxide, indium-zinc oxide, or the like. These may be used alone or in combination with each other. According to an embodiment, the second pixel electrode PXE2 may be referred to as an anode electrode.

The first partition wall PDL1 may be disposed on the circuit layer CIR and the second pixel electrode PXE2. The first partition wall PDL1 may define a second pixel opening exposing a portion of the second pixel electrode PXE2. The first partition wall PDL1 may include an organic insulating material. In an embodiment, for example, the first partition wall PDL1 may include at least one selected from an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

A second light emitting material EL2 may be disposed on the second pixel electrode PXE2 in the second pixel opening. According to an embodiment, the second light emitting material EL2 may extend from an inside of the second pixel opening so that the second light emitting material EL2 may also be disposed on a top or upper surface of the first partition wall PDL1. The second light emitting material EL2 may include a material for emitting a light. In an embodiment, for example, the second light emitting material EL2 may include an organic light emitting material. In such an embodiment, the second light emitting material EL2 may further include at least one selected from a hole injection layer, a hole transport layer, an electron injection layer, and an electron transport layer.

The common electrode CE may be disposed on the first partition wall PDL1 and the second light emitting material EL2. The common electrode CE may include a transparent conductive material. In an embodiment, for example, the common electrode CE may include indium-tin oxide, indium-zinc oxide, or the like. According to an embodiment, the common electrode CE may be referred to as a cathode electrode.

The second pixel electrode PXE2 exposed by the second pixel opening, the second light emitting material EL2 disposed in the second pixel opening, and the common electrode CE overlapping each second light emitting material EL2 disposed in the second pixel opening may collectively define or constitute a second light emitting element. In such an embodiment, the second sub-pixel region PXA2 may be a region corresponding to the second pixel opening.

The encapsulation layer EN may cover the second light emitting element to protect the second light emitting element from external moisture and gas. In an embodiment, the encapsulation layer EN may be disposed on the common electrode CE to cover the common electrode CE.

According to an embodiment, the encapsulation layer EN may include a first encapsulation layer EN1, a second encapsulation layer EN2, and a third encapsulation layer EN3, which are sequentially stacked on the common electrode CE. In an embodiment, the first encapsulation layer EN1 may include an inorganic insulating material, the second encapsulation layer EN2 may include an organic insulating material, and the third encapsulation layer EN3 may include an inorganic insulating material. In such an embodiment, since the second encapsulation layer EN2 includes the organic insulating material, the second encapsulation layer EN2 may have a substantially flat top surface, and the third encapsulation layer EN3 disposed on the second encapsulation layer EN2 may also have a substantially flat top surface.

The filling layer FM may be disposed on the encapsulation layer EN. According to an embodiment, the filling layer FM may be spaced apart from the encapsulation layer EN in a third direction DR3 that is perpendicular to the first and second directions DR1 and DR2. In such an embodiment, the third direction DR3 may be a thickness direction of the display device. According to an embodiment, the filling layer FM may include an organic material. In an embodiment, for example, the filling layer FM may include a silicon-based organic material, an epoxy-based organic material, or a mixture of the silicon-based organic material and the epoxy-based organic material.

The protective layer PL may be disposed on the filling layer FM. The protective layer PL may include an inorganic insulating material. In an embodiment, for example, the protective layer PL may include silicon oxide, silicon nitride, or the like.

The second partition wall PDL2 and the second color conversion material CCL2 may be disposed on the protective layer PL. In an embodiment, the second color conversion material CCL2 may be disposed in a second opening defined by the second partition wall PDL2 and overlapping the second pixel opening. The second color conversion material CCL2 may include a second particle PT2. The second particle PT2 may include at least one selected from a second wavelength conversion particle configured to convert a wavelength of a light emitted from the second light emitting material EL2, and a second scattering particle configured to scatter the light emitted from the second light emitting material EL2. Accordingly, the light emitted from the second light emitting material EL2 may pass through the second color conversion material CCL2, and the wavelength of the light may be changed, or the light may be scattered. The second color conversion material CCL2 and the second partition wall PDL2 may be defined as a second color conversion layer.

The functional layer FNL may be disposed on the second color conversion material CCL2 and the second partition wall PDL2. The functional layer FNL may include layers having various functions for improving exiting light efficiency of the light emitted from the second light emitting material EL2 or improving functions of the display device. According to an embodiment, the functional layer FNL may include an input sensing layer configured to sense an input of the user of the display device. According to an alternative embodiment, the functional layer FNL may include a color filter layer configured to selectively transmit a light having a specific wavelength among lights passing through the second color conversion material CCL2.

The second substrate SUB2 may be disposed on the functional layer FNL. The second substrate SUB2 may include transparent glass, plastic, or the like. According to an embodiment, the second substrate SUB2 may have a flexible property.

The first substrate SUB1, the circuit layer CIR, the second pixel electrode PXE2, the first partition wall PDL1, the second light emitting material EL2, the common electrode CE, and the encapsulation layer EN may be defined as a light emitting element substrate. In addition, the filling layer FM, the protective layer PL, the second partition wall PDL2, the second color conversion material CCL2, the functional layer FNL, and the second substrate SUB2 may be defined as a color conversion substrate. In such an embodiment, a light emitted from the light emitting element substrate may pass through the color conversion substrate be converted into a light having a specific wavelength.

Figure 3:
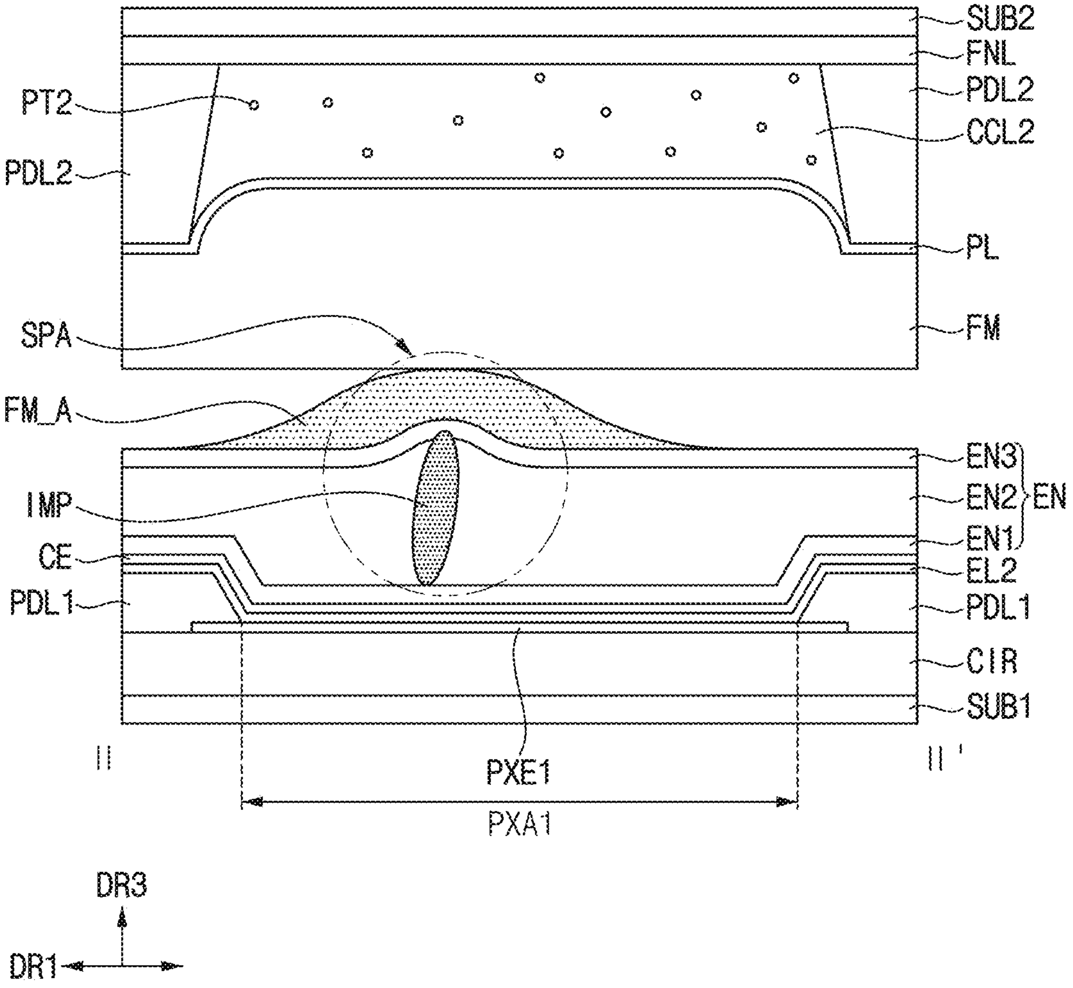
FIG. 3 is a cross-sectional view taken along line II-II' of FIG. 1.

FIG. 3 is a cross-sectional view taken along line II-II' of FIG. 1. Any repetitive detailed descriptions of the same or like elements in FIG. 3 as those described above with reference to FIG. 2 will be omitted or simplified.

Referring to FIG. 3, a first pixel electrode PXE1 may be disposed on the circuit layer CIR. The first pixel electrode PXE1 may include a conductive material. In an embodiment, for example, the first pixel electrode PXE1 may include silver, a silver-containing alloy, titanium, a titanium-containing alloy, molybdenum, a molybdenum-containing alloy, aluminum, an aluminum-containing alloy, aluminum nitride, tungsten, tungsten nitride, copper, indium-tin oxide, indium-zinc oxide, or the like. These may be used alone or in combination with each other. According to an embodiment, the first pixel electrode PXE1 may be referred to as an anode electrode.

The first partition wall PDL1 may be disposed on the circuit layer CIR and the first pixel electrode PXE1. The first partition wall PDL1 may define a first pixel opening exposing a portion of the first pixel electrode PXE1.

A first light emitting material EL1 may be disposed on the first pixel electrode PXE1 in the first pixel opening. According to an embodiment, the first light emitting material EL1 may extend from an inside of the first pixel opening so that the first light emitting material EL1 may also be disposed on the top surface of the first partition wall PDL1. The first light emitting material EL1 may include a material for emitting a light. In an embodiment, for example, the first light emitting material EL1 may include an organic light emitting material. In such an embodiment, the first light emitting material EL1 may further include at least one selected from a hole injection layer, a hole transport layer, an electron injection layer, and an electron transport layer.

The common electrode CE may be disposed on the first partition wall PDL1 and the first light emitting material EL1. According to an embodiment, the common electrode CE may be referred to as a cathode electrode.

The first pixel electrode PXE1 exposed by the first pixel opening, the first light emitting material EL1 disposed in the first pixel opening, and the common electrode CE overlapping each first light emitting material EL1 disposed in the first pixel opening may define a first light emitting element. In such an embodiment, the first sub-pixel region PXA1 may be a region corresponding to the first pixel opening.

The encapsulation layer EN may cover the first light emitting element to protect the first light emitting element from external moisture and gas. In an embodiment, a foreign substance IMP may be present in the encapsulation layer EN. The foreign substance IMP may pass (or be disposed) through at least a portion of the encapsulation layer EN. In an embodiment, for example, the foreign substance IMP may pass through at least a portion of a second encapsulation layer EN2. In such an embodiment, since the foreign substance IMP is present, a protruding part of the encapsulation layer EN may be defined by a portion of the encapsulation layer EN which is protruded from a top flat surface of the encapsulation layer EN by the foreign substance IMP in the third direction DR3.

Since a shape of the foreign substance IMP shown in FIG. 3 has been provided for illustrative purposes, the disclosure is not limited thereto. The foreign substance IMP may have various shapes capable of generating cracks in the encapsulation layer EN. In an embodiment, for example, a portion of the foreign substance IMP may protrude from the top surface of the encapsulation layer EN. In such an embodiment, the protruding part may be defined as the portion of the foreign substance IMP protruding from the top surface of the encapsulation layer EN. Embodiments of various shapes of the foreign substance IMP will be described below with reference to FIGS. 5, 7, and 9.

If a crack is generated in the encapsulation layer EN by the foreign substance IMP, the common electrode CE, the first light emitting material ELL the first pixel electrode PXE1, and the circuit layer CIR may be exposed to the external moisture and gas. Accordingly, the common electrode CE, the first light emitting material ELL the first pixel electrode PXE1, and the circuit layer CIR may be damaged.

In an embodiment, a reinforcing filling layer FM_A may be disposed on the protruding part to prevent a crack from being generated in the encapsulation layer EN by the foreign substance IMP. The reinforcing filling layer FM_A may include a material that is substantially identical to a material included in the filling layer FM, and may cover the protruding part formed by the foreign substance IMP to protect the encapsulation layer EN, which is vulnerable to the generation of cracks. In such an embodiment, a region in which the reinforcing filling layer FM_A is disposed may be defined as a reinforcing region SPA. Accordingly, the crack may not be substantially generated in the encapsulation layer EN, so that the common electrode CE, the first light emitting material ELL the first pixel electrode PXE1, and the circuit layer CIR may be effectively prevented from being damaged by the generation of cracks.

The filling layer FM may be disposed on the encapsulation layer EN. According to an embodiment, the filling layer FM may be in contact with the reinforcing filling layer FM_A, and may be spaced apart from the encapsulation layer EN in the third direction DR3 that is perpendicular to the first and second directions DR1 and DR2.

The second partition wall PDL2 may define a first opening in which a first color conversion material CCL1 is disposed and overlapping the first pixel opening. The first color conversion material CCL1 may include a first particle PT1. The first particle PT1 may include at least one of a first wavelength conversion particle configured to convert a wavelength of a light emitted from the first light emitting material ELL and a first scattering particle configured to scatter the light emitted from the first light emitting material EL1. Accordingly, the light emitted from the first light emitting material EL1 may pass through the first color conversion material CCL1, and the wavelength of the light may be changed, or the light may be scattered. The first color conversion material CCL1 and the second partition wall PDL2 may be defined as a first color conversion layer.

The first substrate SUB1, the circuit layer CIR, the first pixel electrode PXE1, the first partition wall PDL1, the first light emitting material EL1, the common electrode CE, and the encapsulation layer EN may be defined as the light emitting element substrate. In addition, the filling layer FM, the protective layer PL, the second partition wall PDL2, the first color conversion material CCL1, the functional layer FNL, and the second substrate SUB2 may be defined as the color conversion substrate.

Referring to FIGS. 1 and 3, in an embodiment, the reinforcing filling layer FM_A may be disposed on the encapsulation layer EN in the reinforcing region SPA to prevent cracks from being generated in the encapsulation layer EN by the foreign substance IMP.

In such an embodiment, the first sub-pixel region PXA1 overlapping a region in which the reinforcing filling layer FM_A is disposed when viewed in a plan view among the first to fourth sub-pixel regions PXA1, PXA2, PXA3, and PXA4 may be referred to as an overlapping region, and the first light emitting element disposed in the first sub-pixel region PXA1 may be referred to as an overlapping-light emitting element. In addition, each of the second to fourth sub-pixel regions PXA2, PXA3, and PXA4 spaced apart from the reinforcing filling layer FM_A when viewed in a plan view among the first to fourth sub-pixel regions PXA1, PXA2, PXA3, and PXA4 may be referred to as a non-overlapping region, and a light emitting element disposed in each of the second to fourth sub-pixel regions PXA2, PXA3, and PXA4 may be referred to as a non-overlapping-light emitting element.

A sum of a thickness of the reinforcing filling layer FM_A in the third direction DR3 in the reinforcing region SPA and a thickness of the filling layer FM in the third direction DR3 may be greater than a thickness of the filling layer FM in the third direction DR3 in a region that is adjacent to the reinforcing region SPA. Accordingly, the user of the display device may visually recognize a decrease in a luminance in the reinforcing region SPA. In an embodiment, for example, the light emitted from the first light emitting material EL1 in the first sub-pixel region PXA1 referred to as the overlapping region may be transmitted through the reinforcing region SPA to have a relatively low luminance. Accordingly, a dark spot may be visually recognized by the user of the display device in the reinforcing region SPA, and an overall luminance in the first sub-pixel region PXA1 may be decreased.

In an embodiment, a luminance of a light emitted from the first sub-pixel region PXA1 including the reinforcing region SPA may be compensated to prevent a dark spot from being visually recognized by the user. In such an embodiment, when the display device is driven, the luminance of the light emitted from the first sub-pixel region PXA1 may be increased in a way such that a value obtained by dividing the luminance of the light emitted from the first sub-pixel region PXA1 including the reinforcing region SPA by an area of the first sub-pixel region PXA1 may be about 95% or greater and about 105% or less of a value obtained by dividing a luminance of a light emitted from the second sub-pixel region PXA2 that does not include the reinforcing region SPA by an area of the second sub-pixel region PXA2. In such an embodiment, a driving current corresponding to a luminance having a relatively high level may be supplied to the first pixel electrode PXE1 disposed in the first sub-pixel region PXA1, so that the first light emitting material EL1 disposed in the first sub-pixel region PXA1 may emit a light having a relatively high luminance.

FIGS. 4 to 15 are views for describing a method for manufacturing a display device according to an embodiment of the disclosure. Any repetitive detailed descriptions of the same or like elements in FIGS. 4 to 15 as those described above with reference to FIGS. 1 to 3 will be omitted or simplified.

Figure 4:
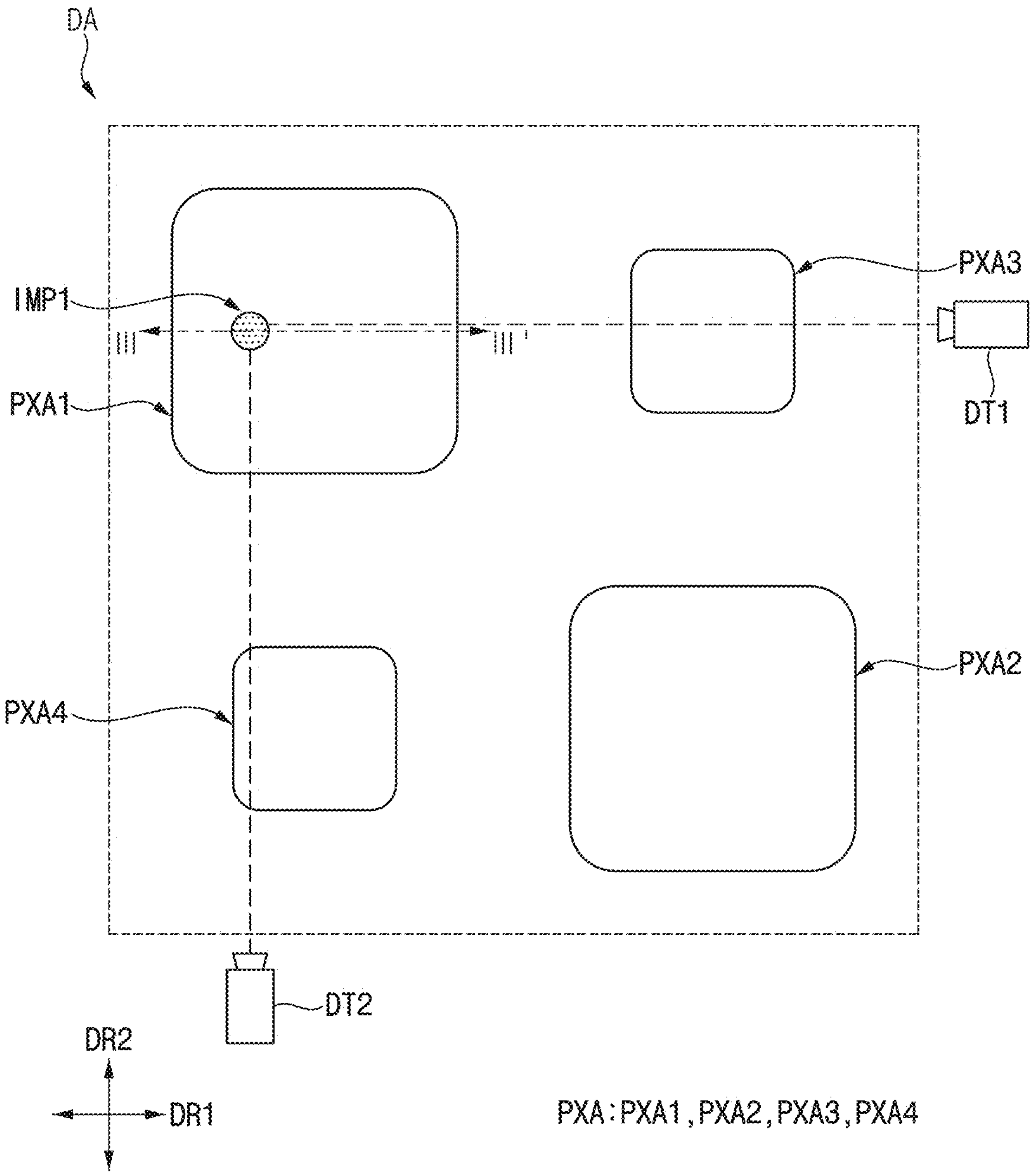
FIGS. 4 to 15 are views for describing a method for manufacturing a display device according to an embodiment of the disclosure.
Figure 5:
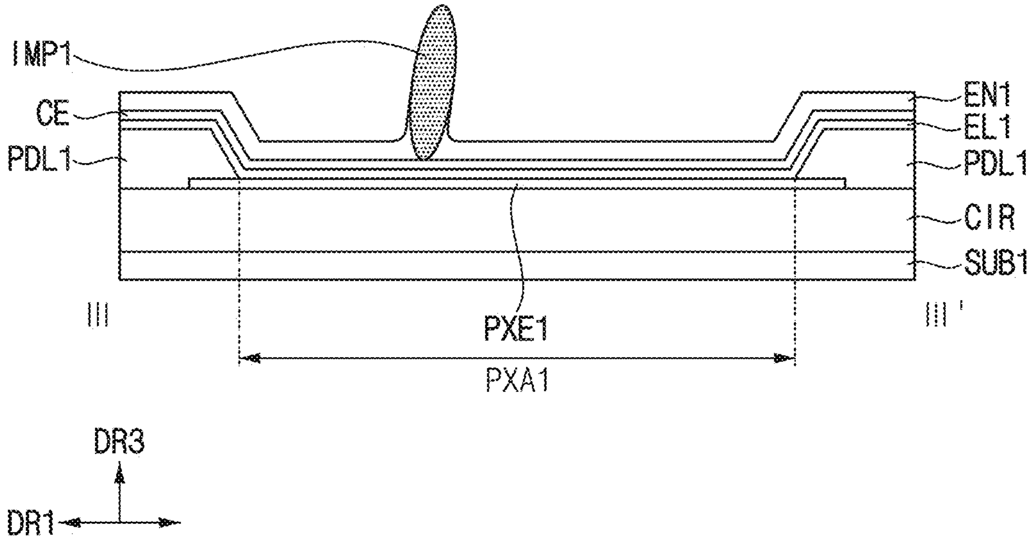

Referring to FIGS. 4 and 5, after the first encapsulation layer EN1 covering the common electrode CE is formed, a first position of a first foreign substance IMP1 may be detected. The first foreign substance IMP1 may be a foreign substance generated in a process of forming the first encapsulation layer EN1.

According to an embodiment, a first detector DT1 configured to emit a first laser beam traveling in the first direction DR1 to detect a position of a foreign substance in the second direction DR2 and a second detector DT2 configured to emit a second laser beam traveling in the second direction DR2 to detect a position of the foreign substance in the first direction DR1 may be used to detect the first position of the first foreign substance IMP1. However, since the above configuration has been provided for illustrative purposes, the disclosure is not limited thereto.

As shown in FIG. 5, the first foreign substance IMP1 may pass through a portion of the first encapsulation layer EN1, and may have a thickness in the third direction DR3. However, since the above configuration has been provided for illustrative purposes, a shape of the first foreign substance IMP1 is not limited thereto. In an embodiment, for example, the first foreign substance IMP1 may be disposed on the first encapsulation layer EN1 without passing through the first encapsulation layer EN1, and may have a thickness in the third direction DR3.

Figure 6:
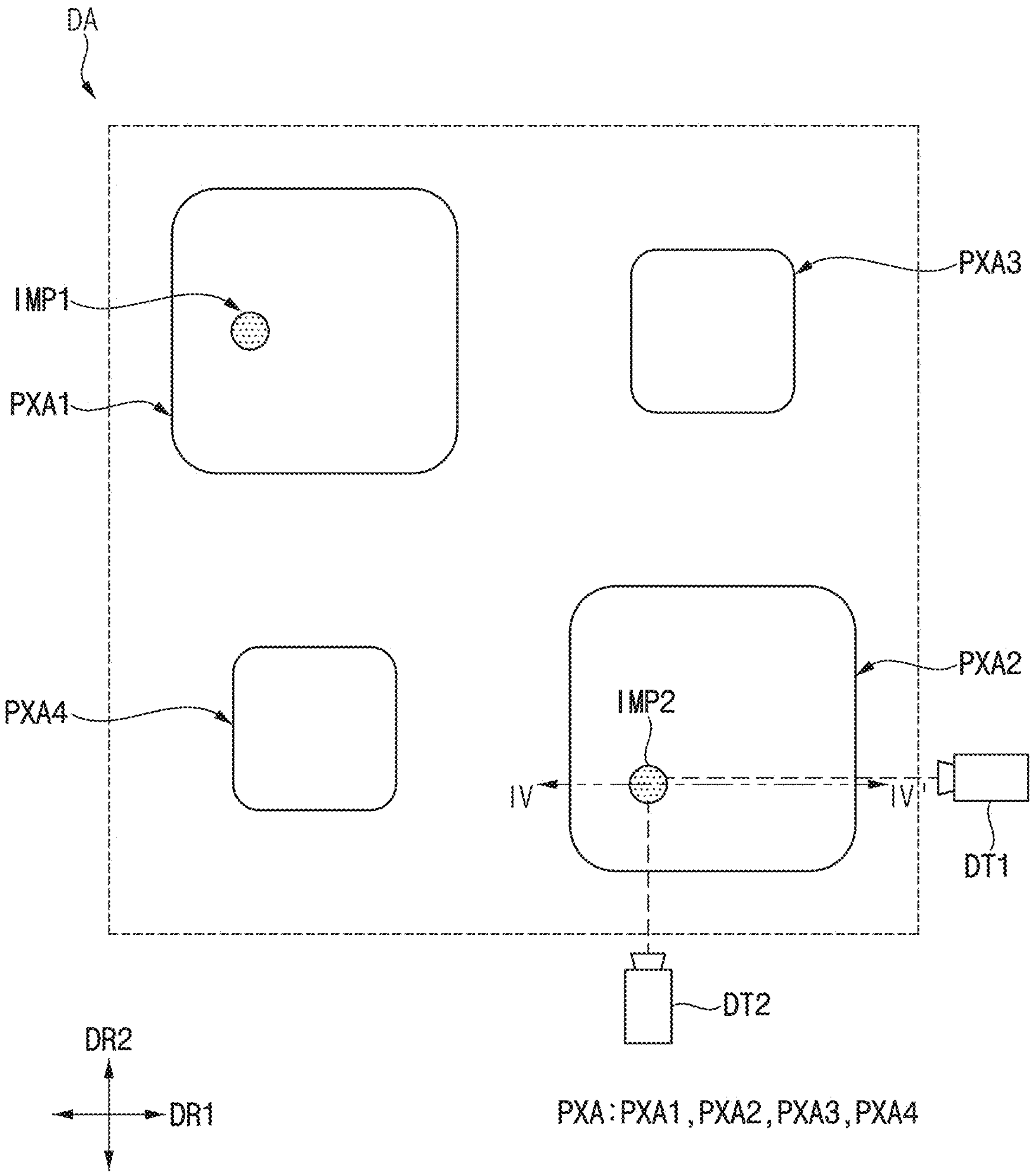
Figure 7:
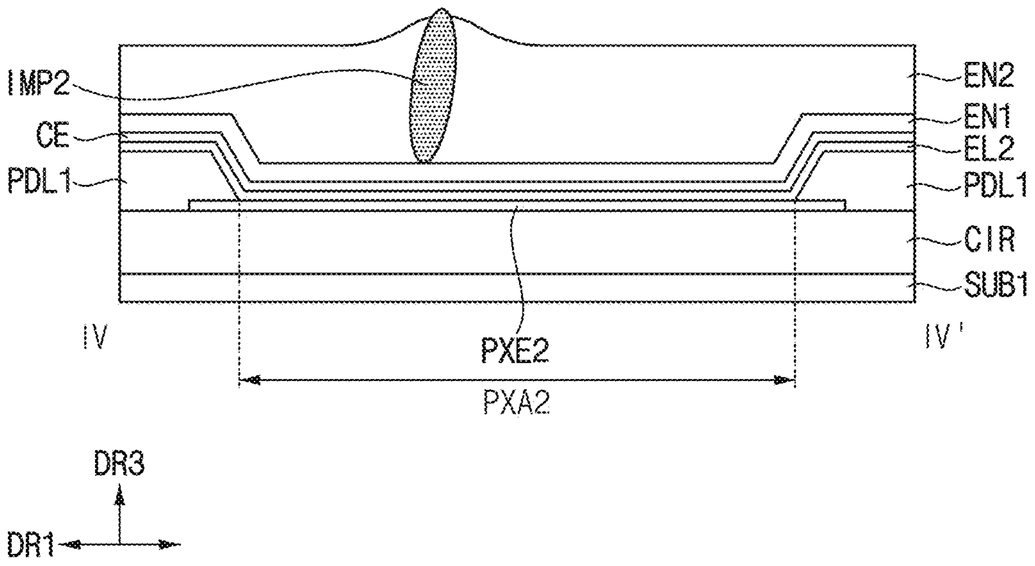

Referring to FIGS. 6 and 7, after the first position of the first foreign substance IMP1 is detected, the second encapsulation layer EN2 may be formed, and a second position of a second foreign substance IMP2 may be detected. The second foreign substance IMP2 may be a foreign substance generated in a process of forming the second encapsulation layer EN2.

As shown in FIG. 7, the second foreign substance IMP2 may pass through a portion of the second encapsulation layer EN2, and may have a thickness in the third direction DR3. However, since the above configuration has been provided for illustrative purposes, a shape of the second foreign substance IMP2 is not limited thereto. In an embodiment, for example, the second foreign substance IMP2 may be disposed on the second encapsulation layer EN2 without passing through the second encapsulation layer EN2, and may have a thickness in the third direction DR3.

Figure 8:
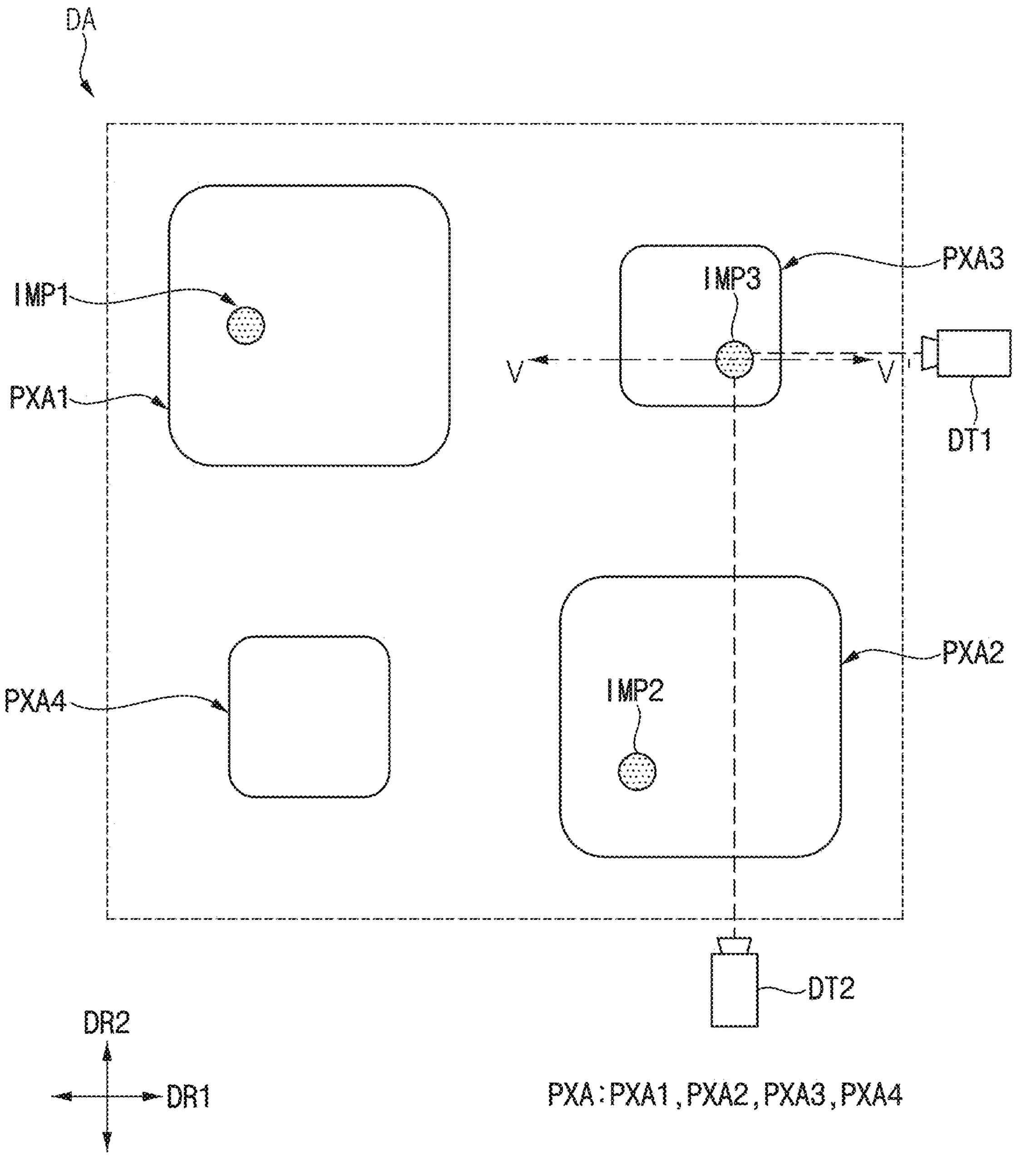
Figure 9:
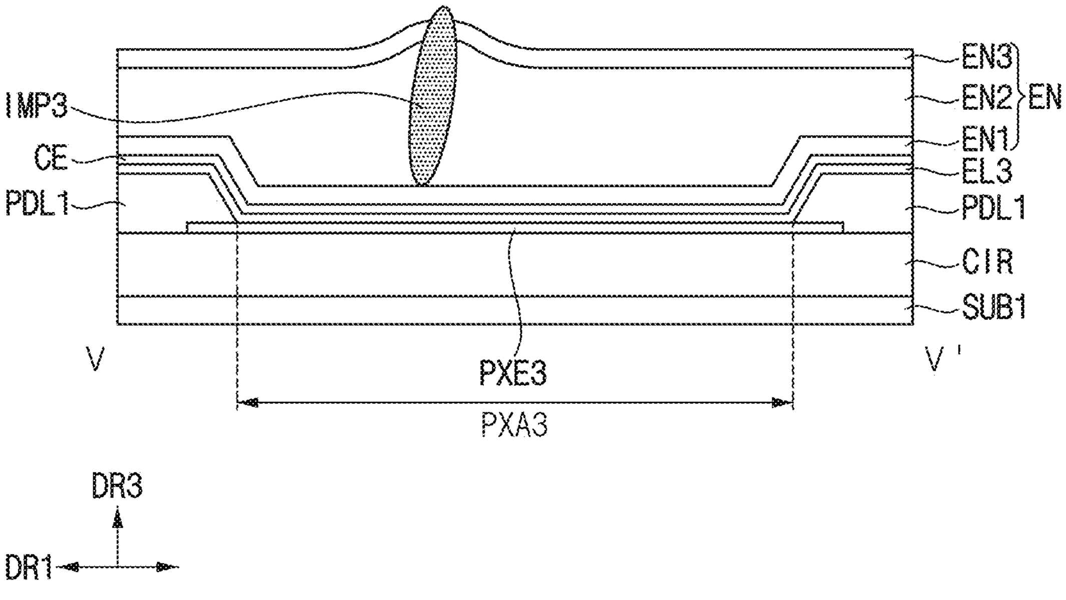

Referring to FIGS. 8 and 9, after the second position of the second foreign substance IMP2 is detected, the third encapsulation layer EN3 may be formed, and a third position of a third foreign substance IMP3 may be detected. The third foreign substance IMP3 may be a foreign substance generated in a process of forming the third encapsulation layer EN3.

As shown in FIG. 9, the third foreign substance IMP3 may pass through the second and third encapsulation layers EN2 and EN3, and may have a thickness in the third direction DR3. In this case, a portion of the third foreign substance IMP3 may protrude from the top surface of the encapsulation layer EN. However, since the above configuration has been provided for illustrative purposes, a shape of the third foreign substance IMP3 is not limited thereto. In an alternative embodiment, for example, the third foreign substance IMP3 may be disposed on the second encapsulation layer EN2 to pass through a portion of the third encapsulation layer EN3, and the portion of the third foreign substance IMP3 may protrude from the top surface of the encapsulation layer EN.

Figure 10:
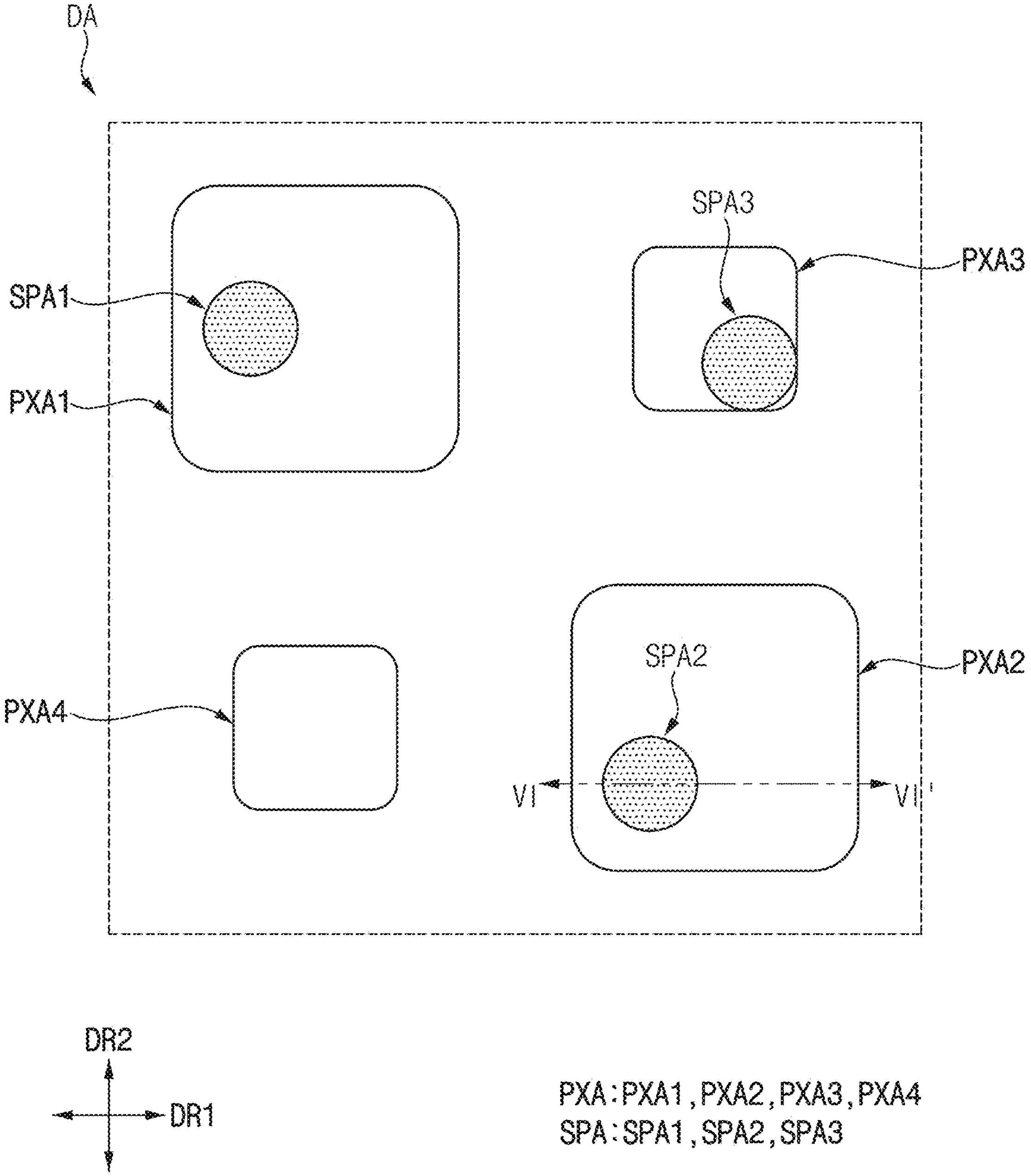
Figure 11:
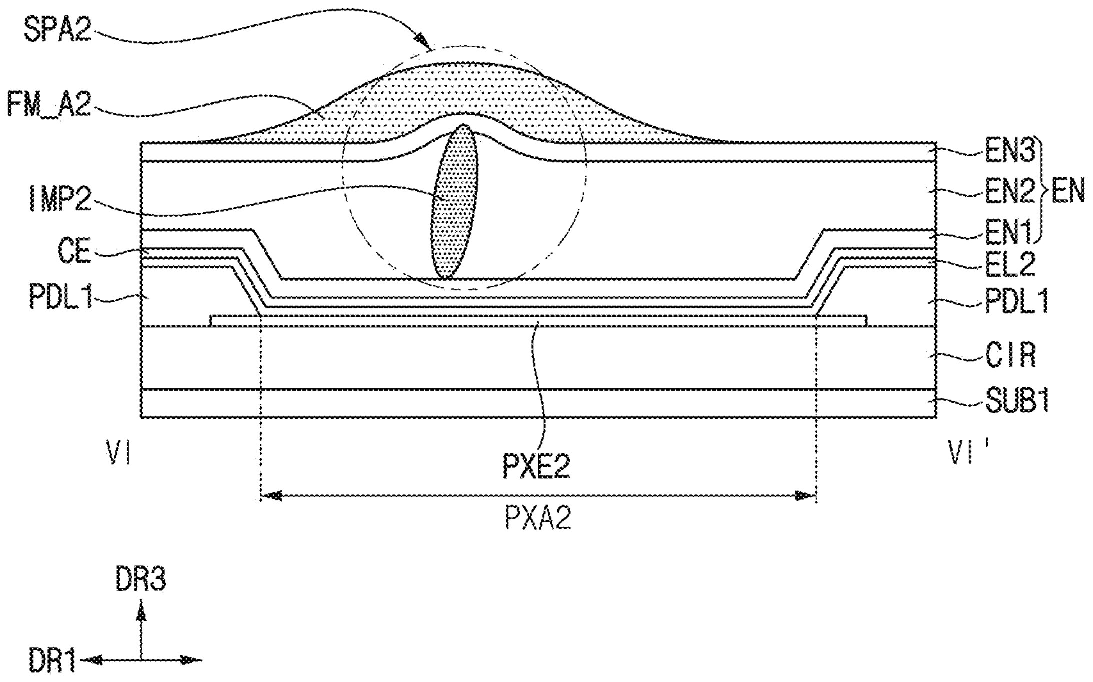

Referring to FIGS. 10 and 11, after the third position of the third foreign substance IMP3 is detected, a profile of the top surface of the encapsulation layer EN at the first position, the second position, and the third position may be inspected. Accordingly, position information of a protruding part defined on the top surface of the encapsulation layer EN by the first to third foreign substances IMP1, IMP2, and IMP3 may be obtained. The protruding part defined on the top surface of the encapsulation layer EN may include a portion of each of the first to third foreign substances IMP1, IMP2, and IMP3 protruding from the top surface of the encapsulation layer EN, or a portion of the top surface of the encapsulation layer EN protruding in the third direction DR3 to cover each of the first to third foreign substances IMP1, IMP2, and IMP3 by the encapsulation layer EN.

In such an embodiment, position information on a foreign substance having a relatively small size (or less than a predetermined size) so as not to be defined as the protruding part in the encapsulation layer EN among the first to third foreign substances IMP1, IMP2, and IMP3 may be removed. In an embodiment, for example, in a case where the first foreign substance IMP1 has a relatively small size, and the second foreign substance IMP2 and the third foreign substance IMP3 have relatively large sizes, in a process of inspecting the profile of the top surface of the encapsulation layer EN, the protruding part may not be formed on the top surface of the encapsulation layer EN at the first position, and the protruding part may be formed on the top surface of the encapsulation layer EN at each of the second position and the third position. In this case, the second position and the third position except for the first position may be classified as the position information of the protruding part. Hereinafter, however, for convenience of description, a case in which each of the first to third foreign substances IMP1, IMP2, and IMP3 has a relatively large size will be described. In this case, the first position, the second position, and the third position may be classified as the position information of the protruding part.

After the position information of the protruding part is obtained, a reinforcing filling layer may be formed on the protruding part of the encapsulation layer EN based on the position information. In this case, a region in which the reinforcing filling layer is formed may be defined as a reinforcing region. In an embodiment, for example, a first reinforcing filling layer (e.g., FM_A of FIG. 1) may be formed on the encapsulation layer EN to cover the protruding part formed by the first foreign substance IMP1 based on the first position, and a region in which the first reinforcing filling layer is formed may be defined as a first reinforcing region SPA1. In addition, a second reinforcing filling layer FM_A2 may be formed on the encapsulation layer EN to cover the protruding part formed by the second foreign substance IMP2 based on the second position, and a region in which the second reinforcing filling layer FM_A2 is formed may be defined as a second reinforcing region SPA2. Similarly, a third reinforcing filling layer (not shown) may be formed on the encapsulation layer EN to cover the protruding part formed by the third foreign substance IMP3 based on the third position, and a region in which the third reinforcing filling layer is formed may be defined as a third reinforcing region SPA3.

In an embodiment, the reinforcing filling layer may be formed by an inkjet scheme. In such an embodiment, an ink including the reinforcing filling layer may be dropped at each of the first position, the second position, and the third position based on the position information, and the ink may be dried.

Referring to FIGS. 4 to 11, at least one selected from a process of detecting the first position described with reference to FIGS. 4 and 5, a process of detecting the second position described with reference to FIGS. 6 and 7, and a process of detecting the third position described with reference to FIGS. 8 and 9 may be omitted. In an embodiment, for example, where all the processes of detecting the first position, the second position, and the third position described with reference to FIGS. 4 to 9 are omitted, the process of inspecting the profile of the top surface of the encapsulation layer EN described with reference to FIGS. 10 to 11 may be performed on an entire top surface of the encapsulation layer EN. Accordingly, the position information obtained by inspecting the profile of the top surface of the encapsulation layer EN after performing all the processes of detecting the first position, the second position, and the third position described with reference to FIGS. 4 to 9 may be substantially the same as the position information obtained by inspecting the profile of the top surface of the encapsulation layer EN without performing all the processes of detecting the first position, the second position, and the third position described with reference to FIGS. 4 to 9.

Figure 12:
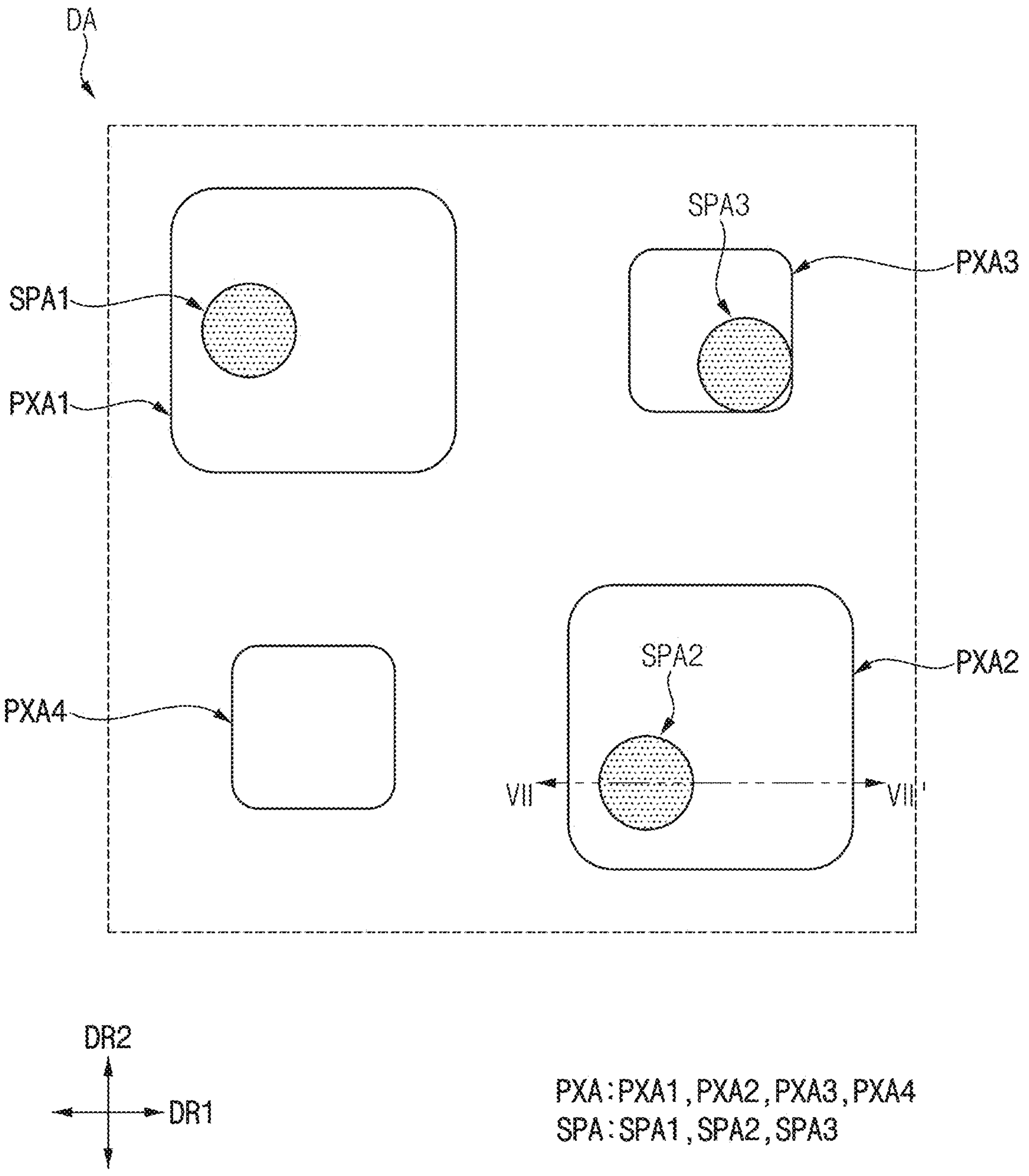
Figure 13:
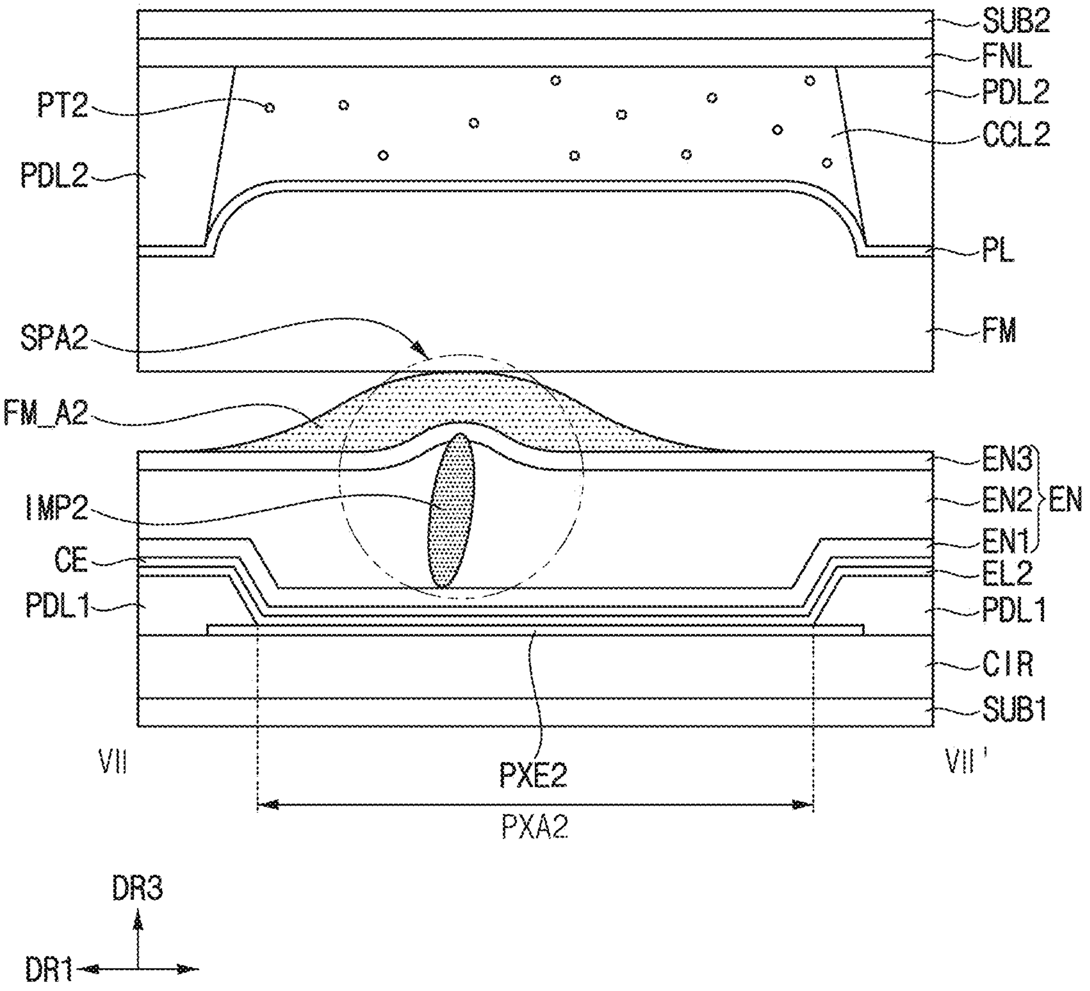

Referring to FIGS. 12 and 13, after the reinforcing filling layer is formed, the color conversion substrate including the filling layer FM, the second partition wall PDL2, a color conversion material disposed in an opening of the second partition wall PDL2, or the like may be bonded onto the reinforcing filling layer. In this process, the filling layer FM and the reinforcing filling layer (e.g., the second reinforcing filling layer FM_A2) may make (or disposed to be in) direct contact with each other.

Figure 14:
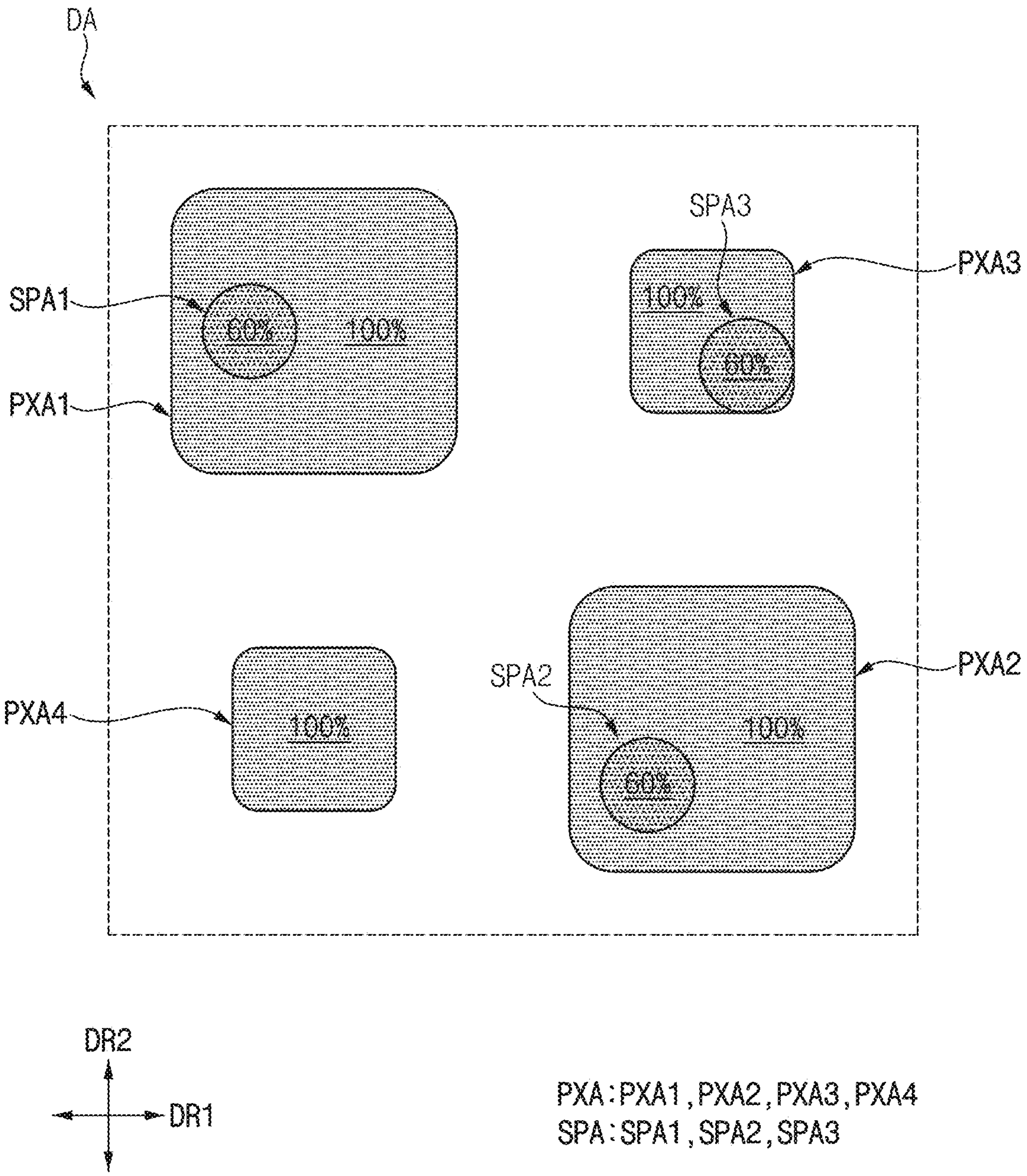
Figure 15:
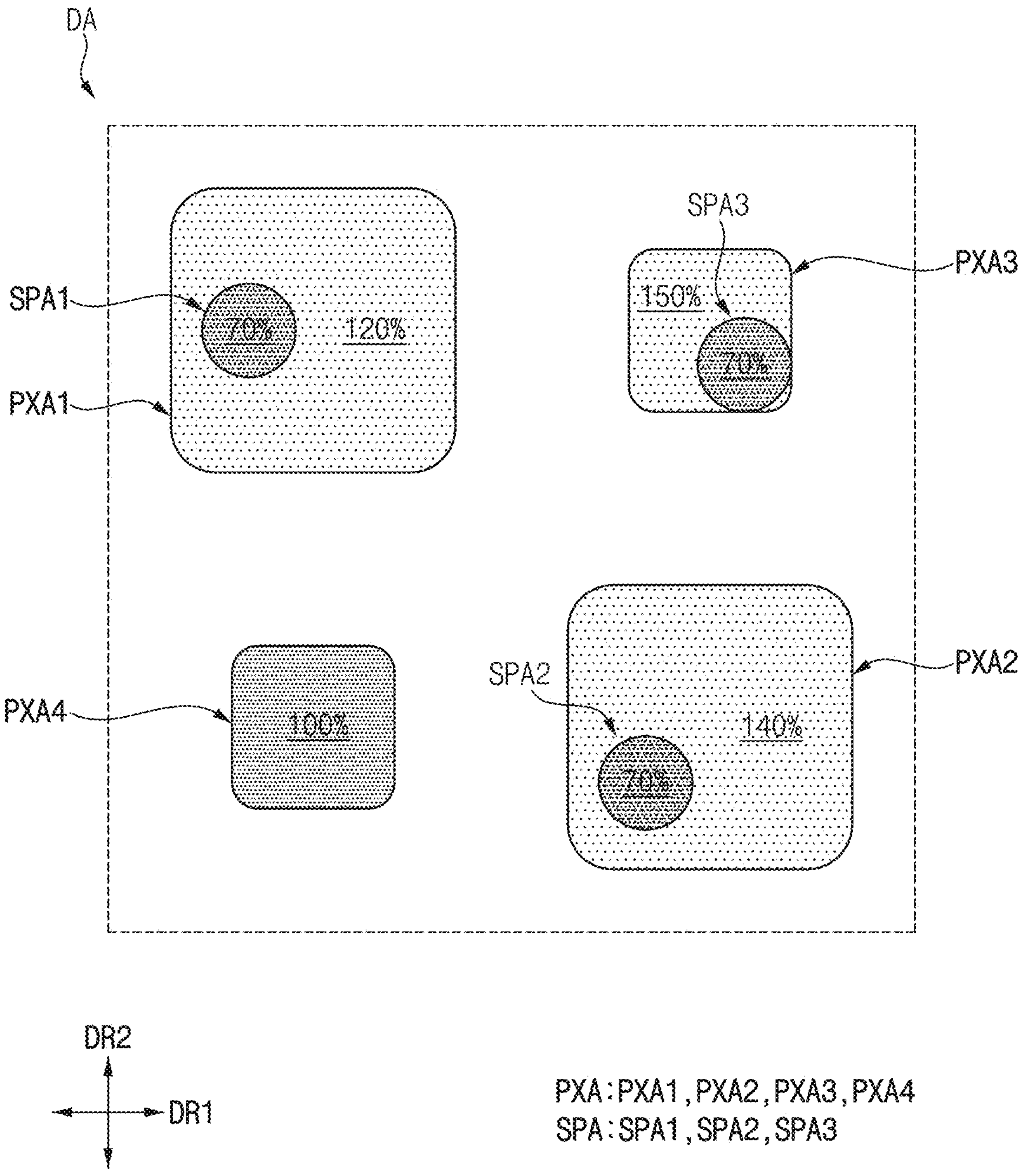

Referring to FIGS. 14 and 15, after the color conversion substrate is bonded onto the reinforcing filling layer, a decrease in a luminance caused by the first to third reinforcing regions SPA1, SPA2, and SPA3 may be compensated.

In an embodiment, as shown in FIG. 14, a light may be emitted from each of the first to fourth sub-pixel regions PXA1, PXA2, PXA3, and PXA4, so that a luminance per unit area may be measured in each of the first to fourth sub-pixel regions PXA1, PXA2, PXA3, and PXA4.

In this case, the fourth sub-pixel region PXA4 spaced apart from the first to third reinforcing regions SPA1, SPA2, and SPA3 among the first to fourth sub-pixel regions PXA1, PXA2, PXA3, and PXA4 may be referred to as a non-overlapping region, and a light emitting element disposed in the fourth sub-pixel region PXA4 may be referred to as a non-overlapping-light emitting element. In addition, each of the first to third sub-pixel regions PXA1, PXA2, and PXA3 overlapping the first to third reinforcing regions SPA1, SPA2, and SPA3 among the first to fourth sub-pixel regions PXA1, PXA2, PXA3, and PXA4 may be referred to as an overlapping region, and a light emitting element disposed in each of the first to third sub-pixel regions PXA1, PXA2, and PXA3 may be referred to as an overlapping-light emitting element.

In this case, a light having a relatively low luminance may be emitted from the first to third reinforcing regions SPA1, SPA2, and SPA3. In an embodiment, for example, when assuming that a relative luminance of a light emitted from a region that does not overlap the first to third reinforcing regions SPA1, SPA2, and SPA3 in the first to fourth sub-pixel regions PXA1, PXA2, PXA3, and PXA4 is about 100%, a relative luminance of a light emitted from the first to third reinforcing regions SPA1, SPA2, and SPA3 may be about 60%. Accordingly, a luminance per unit area in each of the first to third sub-pixel regions PXA1, PXA2, and PXA3 including the first to third reinforcing regions SPA1, SPA2, and SPA3 may be smaller than a luminance per unit area in the fourth sub-pixel region PXA4. However, since the above numerical values have been set for illustrative purposes for convenience of description, the numerical values may be variously changed.

Therefore, a first value defined as a luminance per unit area in the overlapping region may be smaller than a second value defined as a luminance per unit area in the non-overlapping region. In an embodiment, for example, a value obtained by dividing a luminance of a light emitted from an entire first sub-pixel region PXA1 including the first reinforcing region SPA1 by an area of the first sub-pixel region PXA1 when viewed in a plan view may be smaller than a value obtained by dividing a luminance of a light emitted from an entire fourth sub-pixel region PXA4 by an area of the fourth sub-pixel region PXA4 when viewed in a plan view.

Referring to FIG. 15, a luminance of a light emitted from the overlapping-light emitting element disposed in the overlapping region may be compensated for such that the first value may be about 95% or greater and about 105% or less of the second value.

In an embodiment, for example, a driving current having a level corresponding to a relatively high luminance may be provided to the first pixel electrode PXE1 disposed in the first sub-pixel region PXA1, so that a luminance of the light emitted from the first light emitting material EL1 disposed in the first sub-pixel region PXA1 may be increased. In this case, when compared with a relative luminance of a light emitted from the first sub-pixel region PXA1 shown in FIG. 14, a relative luminance of a light emitted from the first sub-pixel region PXA1 shown in FIG. 15 may be about 70% in the first reinforcing region SPA1, and may be about 120% in a region except for the first reinforcing region SPA1. However, since the above numerical values have been set for illustrative purposes for convenience of description, the numerical values may be variously changed.

When the luminance of the light emitted from the overlapping-light emitting element disposed in the overlapping region is compensated, a proportion of an area occupied by a reinforcing region in a sub-pixel region may be considered.

In an embodiment, for example, the first sub-pixel region PXA1 may have a relatively larger area than the third sub-pixel region PXA3, and areas of the first reinforcing region SPA1 and the third reinforcing region SPA3 may be substantially equal to each other. In such an embodiment, a proportion of an area occupied by the first reinforcing region SPA1 in the first sub-pixel region PXA1 may be smaller than a proportion of an area occupied by the third reinforcing region SPA3 in the third sub-pixel region PXA3. In such an embodiment, a degree to which the luminance of the light emitted from the entire first sub-pixel region PXA1 is decreased by the first reinforcing region SPA1 may be smaller than a degree to which a luminance of a light emitted from an entire third sub-pixel region PXA3 is decreased by the third reinforcing region SPA3. Accordingly, a compensation amount of a driving current provided to the first pixel electrode PXE1 disposed in the first sub-pixel region PXA1 may be set to be smaller than a compensation amount of a driving current provided to the third pixel electrode disposed in the third sub-pixel region PXA3.

The display device and the method for manufacturing the same according to the embodiments of the disclosure may be applied to various electronic devices, for example, a display device included in a computer, a smart phone, a smart pad, a tablet personal computer (PC), or the like.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:

a plurality of light emitting elements;

an encapsulation layer disposed on the light emitting elements to cover the light emitting elements;

a foreign substance disposed on at least one of the light emitting elements, wherein the foreign substance is disposed through at least a portion of the encapsulation layer, and a protruding part is defined by a portion protruding from a top flat surface of the encapsulation layer by the foreign substance;

a reinforcing filling layer disposed on the encapsulation layer to cover the protruding part;

a filling layer disposed on the encapsulation layer and the reinforcing filling layer; and a color conversion layer disposed on the filling layer.

2. The display device of claim 1, wherein the encapsulation layer includes:

a first encapsulation layer disposed on the light emitting elements, and including an inorganic insulating material;

a second encapsulation layer disposed on the first encapsulation layer, and including an organic insulating material; and a third encapsulation layer disposed on the second encapsulation layer, and including an inorganic insulating material.

3. The display device of claim 2, wherein the foreign substance is disposed through at least a portion of the second encapsulation layer.

4. The display device of claim 1, wherein the filling layer is in direct contact with the reinforcing filling layer and spaced apart from the encapsulation layer.

5. The display device of claim 1, wherein the filling layer includes a same material as a material included in the reinforcing filling layer.

6. The display device of claim 1, wherein the protruding part includes at least one selected from a portion of the foreign substance protruding from the top flat surface of the encapsulation layer and a portion of the encapsulation layer in which a profile of a top surface of the encapsulation layer covering the foreign substance protrudes in a thickness direction of the encapsulation layer.

7. The display device of claim 6, wherein the reinforcing filling layer covers the portion of the foreign substance protruding from the top flat surface of the encapsulation layer.

8. The display device of claim 1, further comprising:

a protective layer disposed between the filling layer and the color conversion layer.

9. The display device of claim 1, wherein the color conversion layer includes at least one selected from a color conversion particle and a scattering particle.

10. The display device of claim 1, wherein a value obtained by dividing a luminance of a light in an overlapping region by an area of the overlapping region when viewed in a plan view is 95% or greater and 105% or less of a value obtained by dividing a luminance of a light in a non-overlapping region by an area of the non-overlapping region when viewed in the plan view, the overlapping region is defined as a region in which a light emitted from an overlapping-light emitting element overlapping the reinforcing filling layer when viewed in the plan view among the light emitting elements is visually recognized, and the non-overlapping region is defined as a region in which a light emitted from a non-overlapping-light emitting element not overlapping the reinforcing filling layer when viewed in the plan view among the light emitting elements is visually recognized.

* * * * *